US011956343B2

(12) United States Patent
Weber et al.

(10) Patent No.: US 11,956,343 B2
(45) Date of Patent: Apr. 9, 2024

(54) HIGH RESOLUTION SIGNAL RECEPTION

(71) Applicant: B&R INDUSTRIAL AUTOMATION GMBH, Eggelsberg (AT)

(72) Inventors: Horst Weber, Eggelsberg (AT); Franz Meisl, Eggelsberg (AT)

(73) Assignee: B&R INDUSTRIAL AUTOMATION GMBH, Eggelsberg (AT)

(*) Notice: Subject to any disclaimer, the term of this patent is extended or adjusted under 35 U.S.C. 154(b) by 0 days.

(21) Appl. No.: 17/854,176

(22) Filed: Jun. 30, 2022

(65) Prior Publication Data

US 2023/0006808 A1  Jan. 5, 2023

(30) Foreign Application Priority Data

Jul. 1, 2021  (AT) ............................... A 50549/2021

(51) Int. Cl.
*H04L 7/00* (2006.01)
*H04L 7/033* (2006.01)

(52) U.S. Cl.
CPC .......... *H04L 7/0331* (2013.01); *H04L 7/0087* (2013.01)

(58) Field of Classification Search
CPC ....... H04L 7/0331; H04L 7/0087; G06F 1/14; H04J 3/0697; H03K 5/135
See application file for complete search history.

(56) References Cited

U.S. PATENT DOCUMENTS

| | | | |
|---|---|---|---|
| 4,216,544 A | 8/1980 | Boleda | |
| 4,849,703 A | 7/1989 | Easley et al. | |
| 6,122,337 A | 9/2000 | Bleiweiss et al. | |
| 7,451,337 B1 | 11/2008 | Hewitt | |
| 8,666,006 B1* | 3/2014 | Fu | H04L 7/0337 713/400 |
| 8,698,530 B2 | 4/2014 | Blondel | |
| 10,224,937 B1* | 3/2019 | Wu | H04L 12/437 |

(Continued)

FOREIGN PATENT DOCUMENTS

EP  3 053 287  8/2016
EP  3 404 866  11/2018
(Continued)

OTHER PUBLICATIONS

Europe Search Report/Office Action conducted in counterpart Europe Patent Application No. 22 18 1721.6 (dated Dec. 7, 2022).

(Continued)

*Primary Examiner* — Dac V Ha
(74) *Attorney, Agent, or Firm* — GREENBLUM & BERNSTEIN, P.L.C.

(57) ABSTRACT

A method for reception of a signal by a subscriber of a real-time network. The signal includes a signal clock having a signal clock frequency and the subscriber includes a counter, which has a counter clock with a counter clock frequency and which maps a local time of the subscriber. The method includes sampling the signal with a reception clock of a reception counter of the subscriber, the reception clock being derived from the counter clock, whereby the reception counter maps the local time of the subscriber, adapting a phase position of the reception clock to a phase position of the signal clock when said reception clock is derived from the counter clock, and sampling the signal at a reception clock frequency of the reception counter.

11 Claims, 2 Drawing Sheets

(56) References Cited

U.S. PATENT DOCUMENTS

| | | | |
|---|---|---|---|
| 2012/0139597 A1 | 6/2012 | Blondel | |
| 2018/0059159 A1* | 3/2018 | Hsu | H03K 5/19 |
| 2018/0343183 A1 | 11/2018 | Pope et al. | |
| 2019/0007191 A1 | 1/2019 | Wang | |
| 2019/0165927 A1 | 5/2019 | Wang | |
| 2020/0221362 A1* | 7/2020 | Kessler | H04W 36/305 |
| 2021/0111859 A1* | 4/2021 | Gaade | H03L 7/0998 |
| 2022/0303036 A1 | 3/2022 | Chapman et al. | |

FOREIGN PATENT DOCUMENTS

| | | |
|---|---|---|
| WO | 2015/049479 | 4/2015 |
| WO | 2020/261066 | 12/2020 |

OTHER PUBLICATIONS

Aliaga et al., "PET System Synchronization and Timing Resolution Using High-Speed Data Links," IEEE Transactions on Nuclear Science, Bd. 58, No. 4, XP011373129, ISSN: 0018-9499, DOI: 10.1109/TNS.2011.2140130, pp. 1596-1605 (Aug. 1, 2011).

Austria Search Report conducted in counterpart Austria Patent Application No. A 50549/2021 (dated Jul. 1, 2021).

\* cited by examiner

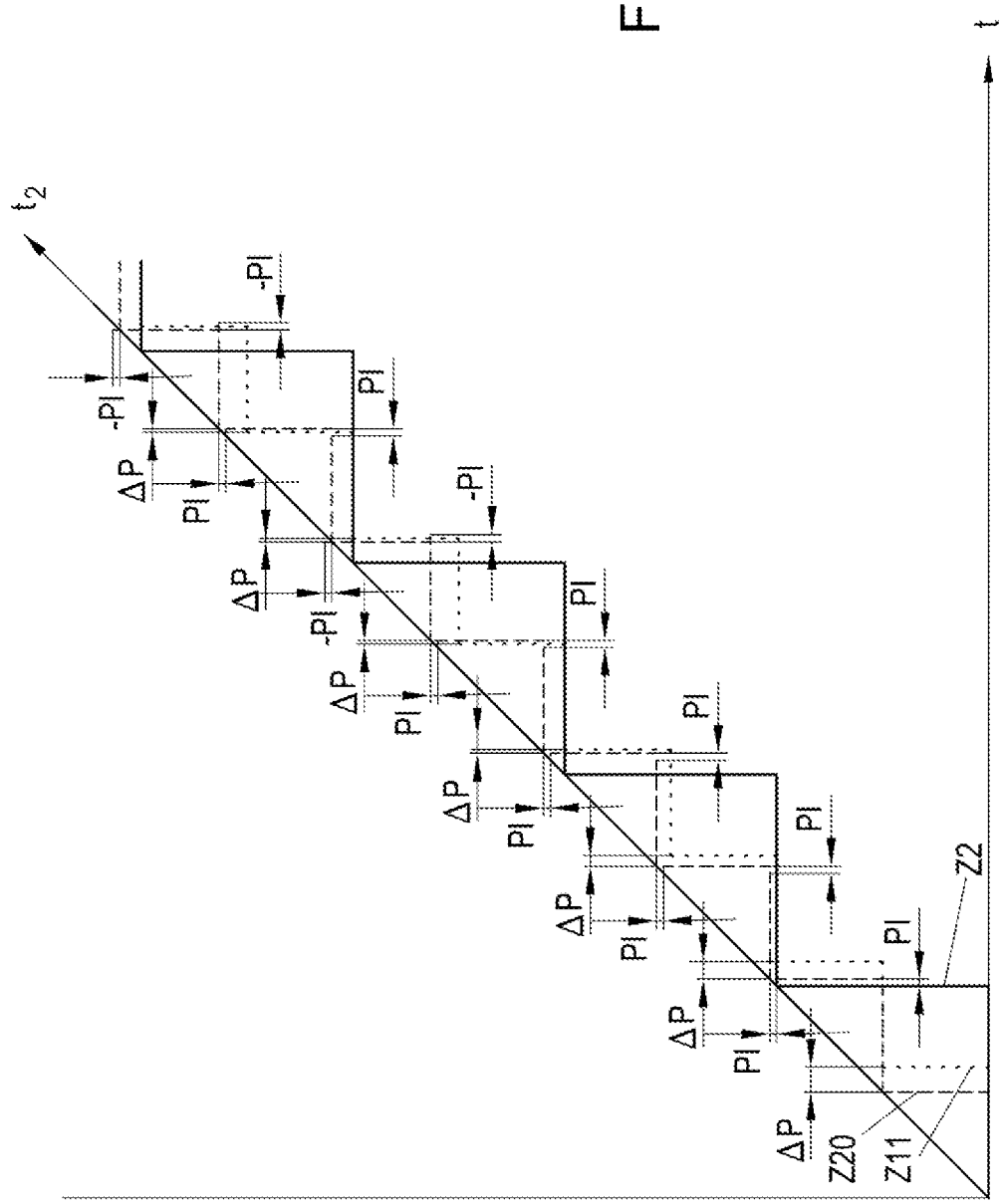

HIGH RESOLUTION SIGNAL RECEPTION

CROSS-REFERENCE TO RELATED APPLICATION

This application claims priority under 35 U.S.C. § 119(a) to Austria Application No. A50549/2021 filed Jul. 1, 2021, the disclosure of which is expressly incorporated by reference herein in its entirety.

BACKGROUND

1. Field of the Invention

The present invention relates to a method for reception of a signal by a subscriber in a real-time network, the signal having a signal clock having a signal clock frequency and the subscriber comprising a counter that has a counter clock having a counter clock frequency and maps a local time of the subscriber.

2. Discussion of Background Information

Data in the form of digital signals is transmitted between subscribers in a real-time network. A transmitting subscriber comprises a first counter having a first counter clock having a first clock frequency. A receiving subscriber comprises a second counter having a second counter clock having a second clock frequency. Often the second clock frequency does not match the first clock frequency, i.e., it is neither synchronous nor in phase. A counter increases its counter reading in the counter clock at the associated clock frequency, wherein it also is possible for the clock period to be viewed as the inverse of the clock frequency. With this consideration, the counter increments its counter reading every clock period.

The transmitting subscriber transmits the digital signal to the receiving subscriber. In order to transmit information via the signal, the transmitting subscriber quantizes information to be transmitted with the signal at specific points in time, which are specified in the signal clock by a signal clock frequency. Thus, the quantized values of the signal are spaced with the signal clock period. Because the transmitting subscriber comprises a first counter, it uses the first clock frequency of the first counter as the signal clock frequency. The signal is sampled by the receiving subscriber at a sampling clock frequency to quantize the signal. Because the receiving subscriber comprises a second counter, it in turn uses the second clock frequency of the second counter as the sampling clock frequency. If the second clock frequency is adapted to the signal clock frequency, the signal can be reconstructed without loss. It is also common in asynchronous transmissions to sample at a multiple of the bit rate/symbol rate, which is referred to as over-sampling. In this case, sampling frequencies of up to a few 100 MHz are provided. However, the resolution of the sampling of the signal is limited by the second clock frequency of the second counter of the receiving subscriber. If, for example, the second counter is operated at a clock frequency of 125 MHz, i.e., a second clock period of 8 ns, this leads to a resolution of 8 ns. The resolution can only be improved by increasing the clock frequency, which is not possible or only possible to a very limited extent.

Methods are known in which a master provides a clock signal that is recovered by a slave and fed back to the master. The master determines the deviation of the returned clock from the original clock using a phase detector and adjusts its clock signal to reduce the deviation. Said method is being developed at the CERN Institute as part of the White Rabbit project. To achieve a sub-nanosecond resolution, an extension of Synch (Synchronous Ethernet) is used. This makes a very high resolution possible. However, very high demands are also placed on the oscillator in terms of frequency deviation and jitter behavior. Furthermore, only approximately 10 subscribers can be connected in series, because the subscribers always synchronize their signals with the clock of a connected subscriber. Negative effects, such as jitter, etc., also cascade with the clock synchronization, since the signal which is sent to the other subscribers is generated with the clock of the port, with which said subscribers are to be synchronized.

U.S. Pat. No. 8,698,530 B2 discloses a global clock frequency that is made available to all subscribers. In order to achieve a higher resolution that is higher than the global resolution based on the global clock frequency, the local clock frequency is continuously regulated to adapt the clock frequencies of the subscribers to each other. To this end, the counters of the subscribers are operated in different time domains, i.e., each subscriber has a different local time.

SUMMARY

Embodiments provide a flexible method for receiving signals.

According to embodiments, a reception clock of a reception counter of the subscriber is provided for sampling the signal, the reception clock being derived from the counter clock, whereby the reception counter also maps the local time of the subscriber, a phase position of the reception clock being adapted to the phase position of the signal clock, when the reception clock is derived from the counter clock, and the signal being sampled at a reception clock frequency of the reception counter.

The signal can be further processed after sampling. The phase position of the reception clock can be adapted to the phase position of the signal clock, for example, by shifting the phase position of the reception clock in the direction of the phase position of the signal clock.

Since it is not possible to transfer a signal from one clock domain to another asynchronous clock domain (without generating inaccuracies) without special mechanisms, embodiments not only provide the counter in a counter clock domain for mapping the local time, but also an addition reception counter in a reception clock domain, the reception clock of said addition reception counter being derived from the counter clock. Though the reception counter is clock-asynchronous, it is value-synchronous and also maps the local time taking into account a phase shift relative to the counter clock. Thus, a reception counter having a reception clock frequency is provided at the subscriber in addition to a counter clock having a counter clock frequency for mapping the local time. After the timestamp has been formed in the reception clock domain, the information can be transmitted to the counter clock domain via an interface. It is thus desirable to ensure a sufficiently small phase shift between the counter clock and the reception clock so that the timing information of the two domains is synchronized.

The reception clock is preferably derived from the counter clock using a phase-locked loop.

The reception clock frequency can correspond to the counter clock frequency. However, the reception clock frequency is preferably a multiple of the counter clock frequency, whereby the reception counter has a multiple of the resolution of the counter because the signal can be sampled at a higher bit rate.

It can be assumed that the reception clock frequency differs at least slightly from the signal clock frequency, which is why the reception clock and signal clock drift apart leading to a phase shift. This can be remedied, at least temporarily, by a one-time adjustment of the phase position of the reception clock to the signal clock. It is advantageous to also adapt the counter reading of the reception counter to the adjusted phase position, whereby the quantization time of the reception counter can be changed and the signal can be sampled with less uncertainty.

A sign of a phase shill between the reception clock and the signal clock is preferably determined and, based on this the phase position of the reception clock, is changed to adapt the phase position of the reception clock to the phase position of the signal clock. It is possible to recognize in which direction the phase position of the reception clock must be shifted to reduce the phase shift, by determining the sign of the phase shift. However, if the phase position is shifted by an amount greater than the phase shift, overshooting occurs, which in turn changes the sign of the phase shift.

The phase position of the reception clock can be changed over a plurality of reception clock periods. This allows the phase position of the reception clock to be successively adapted to the phase position of the signal clock. When the phase position is changed in one direction based on the previously determined sign of the phase shift and overshooting occurs (i.e., the phase difference changes its sign), then the phase position of the reception clock is shifted in the other direction in the next reception clock period, as a result of which overshoot can occur in the other direction. A situation can arise in which the phase position of the reception clock is changed alternately in one direction and the other and thus alternately overshoots in both directions, i.e. oscillates around the phase position of the signal clock frequency.

In case a phase-locked loop is used to generate the reception clock from the counter clock, it is advantageous that said phase-locked loop supports dynamic phase shifts. The size of said phase shifts is preferably constant. This allows the phase position of the reception clock to be shifted to the counter clock (which serves as a reference clock) in small steps (<<1 ns, depending on the FPGA or ASIC used), which in turn allows the phase position of the reception clock to be continuously adapted to the phase position of the signal clock.

The phase position of the reception clock is preferably changed for each reception clock period by shifting said phase position by a positive or negative phase increment. The current phase position can be determined using a signal edge. Signal edges always occur when 8B10B coding is used, for example. If, based on the sign of the phase shift, the phase position of the reception clock frequency is changed by one phase increment over a plurality of reception clock periods, a phase deviation of less than one (positive or negative) phase increment remains after a sufficient number of shift steps.

The counter reading of the reception counter is preferably changed analogously to the phase position of the reception clock. Thus, the quantization time of the reception counter is adjusted to the local time using the counter reading, such that it is correctly quantized and reproduced. By adjusting the phase position of the reception clock to the phase position of the signal clock and consequently adjusting the reception counter it can be ensured that the signal is sampled with low quantization errors. The resolution with which the received signal can be measured is no longer directly dependent on the counter clock, but on the currently occurring phase shift.

The signal clock frequency is known in advance and can preferably be reconstructed from the signal by the subscriber. If the signal is line-coded, for example with 8B10B line coding, the signal clock frequency can be reconstructed from the signal in a particularly simple manner.

Embodiments are directed to a method for reception of a signal by a subscriber of a real-time network. The signal includes a signal clock having a signal clock frequency and the subscriber includes a counter, which has a counter clock with a counter clock frequency and which maps a local time of the subscriber. The method includes sampling the signal with a reception clock of a reception counter of the subscriber, the reception clock being derived from the counter clock, whereby the reception counter maps the local time of the subscriber, adapting a phase position of the reception clock to a phase position of the signal clock when said reception clock is derived from the counter clock, and sampling the signal at a reception clock frequency of the reception counter.

According to embodiments, the reception clock can be derived from the counter clock using a phase-locked loop.

In accordance with other embodiments, the reception clock frequency of the reception clock can correspond to a counter clock frequency of the counter clock.

In other embodiments, a reception clock frequency of the reception clock may be a multiple of a counter clock frequency of the counter clock.

According to still other embodiments, a sign of a phase shift between the reception clock and the signal clock can be determined, and based on the determined sign of the phase shift, the method can further include changing the phase position of the reception clock in order to adapt the phase position of the reception clock to the phase position of the signal clock. The method can also include changing the phase position of the reception clock for each reception clock period.

In other embodiments, the method can include changing the phase position of the reception clock per reception clock period by shifting said phase position by a positive or negative phase increment.

According to other embodiments, the method may include changing a counter reading of the reception counter analogously to the phase position of the reception clock.

In accordance with still yet other embodiments, the subscriber may reconstruct the signal clock from the signal. The signal can be line-coded. Moreover, the signal can be coded with the 8B10B line coding.

Other exemplary embodiments and advantages of the present invention may be ascertained by reviewing the present disclosure and the accompanying drawing.

BRIEF DESCRIPTION OF THE DRAWINGS

The present invention is described in more detail in the following with reference to FIGS. 1 and 2, which schematically show, in a non-limiting manner, advantageous embodiments of the invention by way of example. In the drawings:

FIG. 2 shows an adaptation of the counter clock to the phase shift.

DETAILED DESCRIPTION

Figure 1:
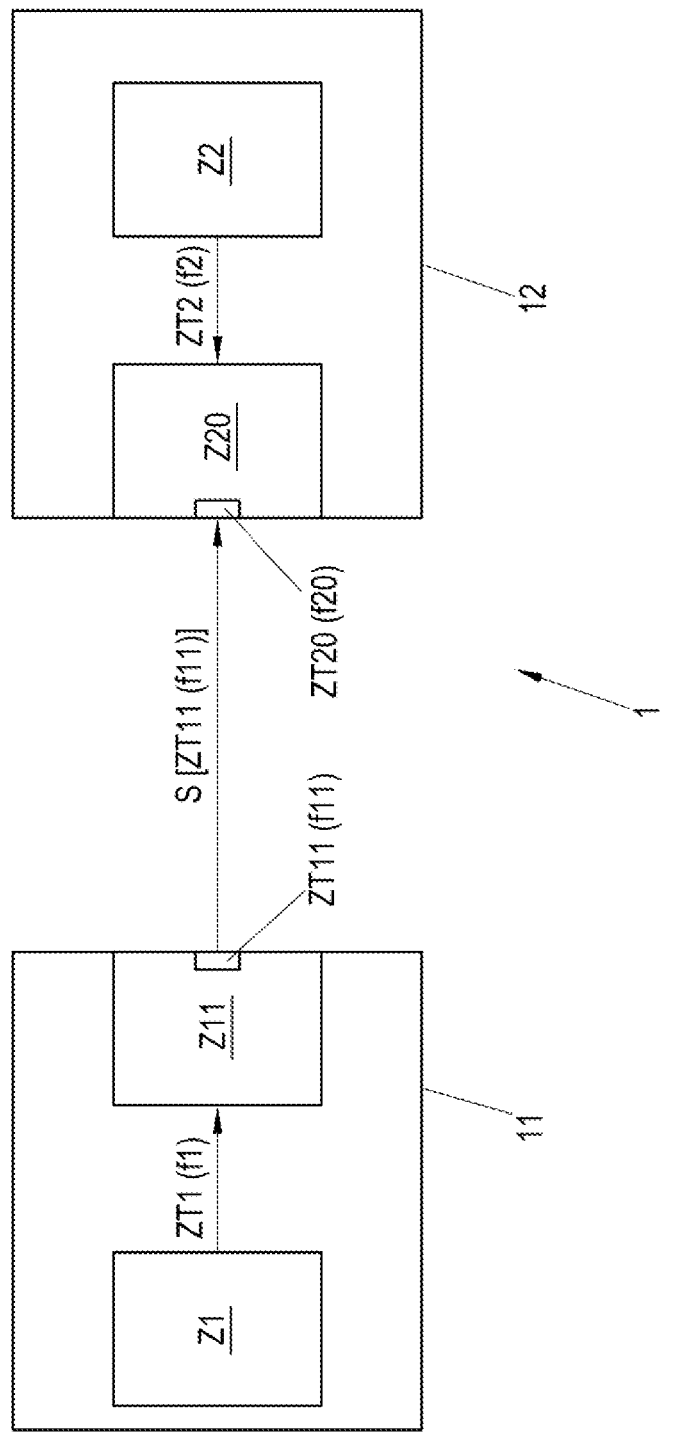
FIG. 1 shows an exemplary real-time network.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

A real-time network 1 is shown in FIG. 1, two subscribers 11, 12 being shown here only by way of example. A transmitting subscriber 11 comprises a first counter Z1 having an associated first counter clock ZT1, the first counter clock ZT1 having a first clock frequency f1. The counter reading of the first counter Z1 increases with the first counter clock ZT1 and thus represents a first local time t1 of the first subscriber 11. The first local time t1 of the first subscriber 11 is thus quantized with the first counter clock ZT1 of the first subscriber 11.

The first subscriber 11 also comprises a transmission counter Z11, which has a transmission clock ZT11. The transmission clock ZT11 is derived from the first counter clock ZT1 and can, for example, correspond to a multiple thereof. The transmission clock ZT11 has a transmission clock frequency f11.

The second subscriber 12 comprises a second counter Z2 having an associated second counter clock ZT2, which has a second clock frequency f2. The counter reading of the second counter Z2 increases with the second counter clock ZT2 and thus forms a second local time t2 of the second subscriber 12, the second local time t2 of the second subscriber 12 being quantized with the second counter clock ZT2.

A first clock period T1 can be viewed as the inverse of the first clock frequency f1 and a second clock period T2 can be viewed as the inverse of the second clock frequency f2.

The transmitting subscriber 11 transmits a signal S to the receiving subscriber 12, the signal S being quantized with the first transmission clock ZT11 of the first subscriber 11. The first transmission clock ZT11 is thus referred to as the signal clock ZT11 and the first transmission clock frequency f11 is referred to as the signal clock frequency f11.

Subsequently, the reception of the signal S by the second subscriber 12 is viewed, so the second subscriber 12 is simply referred to as subscriber 12, the second counter Z2 as counter Z2, the second counter clock ZT2 as counter clock ZT2, the associated second counter clock frequency f2 as counter clock frequency f2 and the second local time t2 as local time t2.

According to the invention, the subscriber 12 comprises a reception counter Z20 in addition to the counter Z2. The reception counter Z20 has a reception clock ZT20 having a reception clock frequency f20, wherein the counter reading of the reception counter Z20 increases with the reception clock ZT20. The reception clock ZT20 is provided for sampling the signal S and is derived from the counter clock Z2. The reception counter Z20 thus maps the local time t2 of the subscriber 12, whereby the local time t2 is also quantized with the reception clock frequency f20.

The reception clock ZT20 is preferably formed from the counter clock ZT2 by a phase-locked loop.

However, since the reception clock ZT20 is provided for sampling the signal S, the phase position of the reception clock ZT20 is adapted to the phase position of the signal clock ZT11 when said reception clock is derived from the counter clock ZT2. The signal S is thus sampled with a small quantization error by the reception clock ZT20.

However, the counter clock frequency f2 and the reception clock frequency f20 do not have to match; on the contrary, the reception clock frequency f20 can be a multiple of the counter clock frequency f2. The counter clock frequency f2 preferably corresponds to the symbol clock frequency of the signal S, the symbol clock frequency being one x-th of the signal clock frequency f11, x representing the number of bits per symbol. For example, x=10 bits per symbol are provided for 8B10B coding, which results in a symbol clock frequency of 51.2 MHz given a signal clock frequency f11 of 512 MHz. If a single data rate (SDR) is provided, then the reception clock frequency f20 corresponds to the signal clock frequency f11. At a double data rate (DDR), the reception clock frequency f20 corresponds to half the signal clock frequency f11. In the case of a signal clock frequency f11 of 512 MHz, this results in a reception clock frequency f20 of 256 MHz.

The resolution of a counter usually corresponds to the clock period of the associated counter, i.e., a resolution of 20 ns for a counter having a clock period of 20 ns.

The real time t is shown on the abscissa in FIG. 2. The counter reading of the counter Z2 and the reception counter Z20 and also the signal clock ZT11 are shown as steps on the ordinate. Each step of the counter Z2 means an increase in the associated counter reading and each step of the reception counter Z20 means an increase in the associated counter reading.

The non-quantized local time t2 is shown as a straight line. The counter Z2 increases its counter reading with the counter clock ZT2, i.e., with the counter clock frequency f2 (or, to put it another way, each counter clock period T2), by a plurality of counter increments I2. The number of counter increments I2 depends on the duration of a counter increment I2 and the desired counter clock period T2. The second local time t2 is reproduced accurately only at the moments of this increase in the counter reading. The local time t2 is reproduced exactly by the counter Z2 only when the counter Z2 intersects the local time t2. At all other points in time, the counter Z2 has quantization errors.

The second subscriber 12 receives a signal S that is quantized with the signal clock ZT11, i.e., with the signal clock frequency f11. According to the invention, a reception clock ZT20 of a reception counter Z20 is derived from the counter clock ZT2, the reception clock frequency f20 of the reception clock ZT20 matching the counter clock frequency f2 of the counter clock ZT2 or being a multiple thereof. The reception counter Z20 increases its counter reading with the reception clock ZT20, i.e., with the reception clock frequency f20 (or, to put it another way, every reception clock period T2), by a plurality of reception counter increments I20, the number of reception counter increments I20 depending on the duration of a reception counter increment I20 and the desired reception counter clock period T2.

The reception counter Z20 is shown in broken lines in FIG. 2. Furthermore, the signal clock ZT11 is shown as a dotted line in FIG. 2. The signal clock ZT11 and thus also the signal clock frequency f11 can be unknown to the second subscriber 12 or else known. However, the (nominal) signal clock frequency f11 is preferably known to the subscriber 12 in advance.

The reception clock frequency f20 corresponds to twice the counter clock frequency f2 in the example shown in FIG. 2. So, the reception clock period T20 corresponds to half the counter clock period T2. It is advantageous, if the reception clock frequency f20 is a multiple, for example five times, the counter clock frequency f2, whereby the resolution of the reception counter Z20 is also a multiple of the counter Z2 and the signal S can be sampled at this increased resolution.

The reception counter Z20 increases its counter reading at the reception clock frequency f20, i.e., per reception clock period T20, by a plurality of reception counter increments I20, the local time t2 only being reproduced exactly at these moments, i.e., only when the reception counter Z20 in FIG. 2 intersects the local time t2.

Under real conditions, a phase shift ΔP can be assumed, which is why the change in the counter reading of the reception counter Z20 takes place at slightly different points in time than a change in the counter reading of the counter Z2. It can also be assumed that the reception clock frequency f20 differs from the signal clock frequency f11 under real conditions.

Therefore, according to the invention, the phase position of the reception clock frequency f20 (and the reception clock period T20) is adapted to the phase position of the signal clock period T11 (and thus that of the signal clock frequency f11). It may be the case that the absolute phase shift ΔP between the reception clock period T20 and the signal clock period T11 is not known, but the sign of the phase shift ΔP is known. In this case it can be determined, for example, whether the phase shift ΔP increases or decreases when there is a change in the reception clock period T20. It is thus possible to conclude whether the phase shift ΔP between the reception clock period T20 and the signal clock period T11 is positive or negative.

The reception clock period T20 is thus synchronized with the signal clock period T11. It can be assumed that an absolute phase shift ΔP remains despite synchronization, which results in a small quantization error after synchronization. In order to ensure that the signal clock period T11 and the reception clock period T20 do not diverge, it is advantageous when the synchronization takes place permanently.

The phase position of the reception clock is preferably shifted by a phase increment PI equal to a counter increment I10 of the reception counter Z20. The sign of the phase shift ΔP is determined, for example, by a phase detector. The sign of the phase shift ΔP can be determined, for example, by first shifting the phase of the reception clock in one direction and then determining whether the phase shift ΔP has increased or decreased. After each introduction of a phase increment PI it is thus possible to determine whether a positive or negative phase increment PI is added in the next reception clock period T20. For example, if the phase shift ΔP is negative but less than a phase increment PI, adding a positive phase increment PI will result in a positive phase shift ΔP (which is also less than a phase increment PI). Therefore, in the next reception clock period T20, a negative phase increment –PI is added, etc. This alternating addition of positive and negative phase increments would, for example, take place permanently if the reception clock period T20 corresponded precisely to the signal clock period T11, but a phase shift ΔP smaller than a phase increment PI remains.

In FIG. 2, a negative phase shift ΔP initially occurs, the amount of which corresponds, for example, to three and a half phase increments PI and is therefore greater in amount than a phase increment PI, which is why a phase increment PI is added in the second reception clock period T20 shown. In the next two reception clock periods T20, it is determined that the phase shift ΔP continues to be negative, which is why the phase of the reception clock period T20 is shifted by a further positive phase increment PI. Thus, the phase shift ΔP is successively reduced to minus two and a half phase increments PI, minus one and a half phase increments PI and finally minus half a phase increment PI. After adding another phase increment PI, a phase shift ΔP of half a phase increment PI occurs.

The transient process is now complete because the phase shift ΔP is positive and has therefore changed signs. In the next reception clock period T20, the phase of the reception clock period T20 is shifted by a negative phase increment –PI. Subsequently, the phase shift ΔP is negative, which is why the phase of the reception clock period T20 is shifted by a positive phase increment PI, etc.

The phase of the reception clock period T20 can be shifted by a phase increment PI, for example, by means of a phase-locked loop.

It is true that the reception clock frequency f20 is asynchronous to the counter clock frequency f2 due to shifting the phase position of the reception clock frequency T20. However, because the phase shifts ΔP are known, they can be taken into account in further processing.

It is particularly advantageous if, in addition to changing the phase of the reception clock period T20, the counter reading of the reception counter Z20 is also changed by a counter difference ΔZ corresponding to the phase shift ΔP, extended by a counter difference ΔZ=ΔP in the case of a positive phase shift ΔP and shortened by a counter difference ΔZ=ΔP in the case of a negative phase shift ΔP. In particular, if the phase shift ΔP is changed by a phase increment PI (corresponding to a counter increment I20), then the counter difference ΔZ is changed by the counter increment I20. In FIG. 2, there is always a change in the phase shift ΔP by a phase increment PI and also an equivalent change in the counter reading of the reception counter Z20 by a counter increment I20 in the amount of a phase increment PI. If the counter reading of the reception counter Z20 in FIG. 2 were not adjusted, then the reception counter would no longer be quantized in the local time t2.

The adaptation of the reception counter Z20 ensures that the local time t2 continues to be mapped correctly by the reception counter Z20 even after the phase shift ΔP. In FIG. 2, the phase position and the counter reading of the reception counter Z20 are changed in the same reception clock period T20 of the reception counter Z20. However, the counter reading can also be changed in a later reception clock period T20 by the counter difference ΔZ, or also piece-wise over a plurality of counter increments I20. Of course, it is only possible to use the added counter difference ΔZ if the reception counter Z20 has a resolution that is greater than a reception frequency f20. For example, a resolution of 1 μs/2^16, i.e., approx. 15.26 ps, can be provided, which corresponds to a frequency of 65.536 GHz. This means that the resolution is 256 times higher than the reception clock frequency f20. If the phase shift ΔP corresponds, for example, to a 24th of the reception clock period T20, then the counter difference ΔZ corresponds to 65.536 GHz/(256 MHz*24)=10.6 (6 is periodic). In order to avoid an accumulation of rounding errors, all decimal places are preferably taken into account and the counter difference ΔZ is matched precisely to the phase shift ΔP.

The reception counter Z20 requires a resolution that corresponds at least to the counter difference ΔZ. An even higher resolution is desirable, particularly when using digital filters. If the reception counter Z20 has a reception clock frequency f20 of 51.2 MHz, it is incremented 1280 times at a resolution of 15.26 ps in a reception clock period T20.

The reception counter Z20 and the counter Z2 therefore represent the same local time t2 and are therefore "value-synchronous," although the reception clock frequency f20 and the counter clock frequency f2 are asynchronous. However, because the phase shifts are known and are arranged before clock data recovery, they can be taken into account in further processing.

In reality, counter oscillators have a maximum deviation of +/− 50 ppm, which means that two signals can deviate by a maximum of 100 ppm. It is therefore sufficient if the (accumulated) phase shift ΔP is not corrected after each counter increment I20 of the reception counter Z20. It is therefore advantageous if the phase shift ΔP is corrected only after a maximum phase deviation has been exceeded, preferably in the amount of half a phase increment PI.

In addition to the above-described subscribers (transmitting and/or receiving), which can be implemented in particular by microprocessor-based hardware, microcontrollers, and/or integrated circuits (ASIC, FPGA), the subscribers can be implemental digitally, as software on microprocessor-based hardware. Thus, the subscribers can be physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies, and/or analog instrumentation, e.g., analog electric/electronic circuits, analog computers, analog devices, etc. Further, the processing of the signal from the transmitting subscriber can be implemented by microprocessors or similar components, programmed using software (e.g., microcode) to perform various functions discussed herein and may optionally be driven by firmware and/or software. Alternatively, the subscribers may be implemented by dedicated hardware, or as a combination of dedicated hardware to perform some functions and a processor (e.g., one or more programmed microprocessors and associated circuitry) to perform other functions.

At least one memory (not shown), e.g., a non-transitory computer readable medium or media, can be provided to store one or more sets of instructions to perform any of the methods or computer-based functions disclosed herein, either alone or in combination with the other described devices. The at least one memory, accessible by the processors, can be part of the subscribers (transmitting and/or receiving) or remote from the subscribers, e.g., a remotely located server, memory, system, or communication network or in a cloud environment.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. A method for reception of a signal by a subscriber of a real-time network, the signal comprising a signal clock having a signal clock frequency and the subscriber comprising a counter, which includes a counter clock having a counter clock frequency and which maps a local time of the subscriber, the method comprising:
    sampling the signal with a reception clock of a reception counter of the subscriber, the reception clock being derived from the counter clock, whereby the reception counter maps the local time of the subscriber,
    adapting a phase position of the reception clock to a phase position of the signal clock when said reception clock is derived from the counter clock, and
    sampling the signal at a reception clock frequency of the reception counter.

2. The method according to claim 1, wherein the reception clock is derived from the counter clock using a phase-locked loop.

3. The method according to claim 1, wherein the reception clock frequency of the reception clock corresponds to a counter clock frequency of the counter clock.

4. The method according to claim 1, wherein a reception clock frequency of the reception clock is a multiple of a counter clock frequency of the counter clock.

5. The method according to claim 1, wherein a sign of a phase shift between the reception clock and the signal clock is determined, and
    further comprising, based on the determined sign of the phase shift, changing the phase position of the reception clock in order to adapt the phase position of the reception clock to the phase position of the signal clock.

6. The method according to claim 5, further comprising changing the phase position of the reception clock for each reception clock period.

7. The method according to claim 1, further comprising changing the phase position of the reception clock per reception clock period by shifting said phase position by a positive or negative phase increment.

8. The method according to claim 1, further comprising changing a counter reading of the reception counter analogously to the phase position of the reception clock.

9. The method according to claim 1, wherein the subscriber reconstructs the signal clock from the signal.

10. The method according to claim 9, wherein the signal is line-coded.

11. The method according to claim 10, wherein the signal is coded with the 8B10B line coding.

* * * * *